(12) United States Patent
Sohn et al.

(10) Patent No.: US 7,541,736 B2
(45) Date of Patent: Jun. 2, 2009

(54) THIENO[3,2-B]INDOLE BASED POLYMER AND ORGANO-ELECTROLUMINESCENT DEVICE USING THE SAME

(75) Inventors: Byung-Hee Sohn, Yongin-si (KR); Hyun-Ju Lim, Seoul (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 500 days.

(21) Appl. No.: 11/037,099

(22) Filed: Jan. 19, 2005

(65) Prior Publication Data

US 2005/0181233 A1     Aug. 18, 2005

(30) Foreign Application Priority Data

Feb. 6, 2004    (KR)   ................... 10-2004-0007824

(51) Int. Cl.
| | |
|---|---|
| *H01L 51/54* | (2006.01) |
| *H05B 33/14* | (2006.01) |
| *C09K 11/06* | (2006.01) |
| *C08F 234/04* | (2006.01) |
| *C08F 34/04* | (2006.01) |
| *C08F 32/06* | (2006.01) |

(52) U.S. Cl. ................... 313/504; 313/506; 257/40; 257/E51.029; 257/E51.032; 428/690; 428/917; 526/256; 526/259; 526/288; 528/377; 528/423

(58) Field of Classification Search ............... 428/690, 428/917; 313/504; 315/506; 558/46; 528/403, 528/377, 423; 526/256, 259
See application file for complete search history.

(56) References Cited

U.S. PATENT DOCUMENTS

| | | | |
|---|---|---|---|
| 4,885,211 A | 12/1989 | Tang et al. | ................. 428/457 |
| 5,151,629 A | 9/1992 | VanSlyke | ................. 313/504 |
| 5,621,131 A | 4/1997 | Kreuder et al. | ................. 558/46 |
| 5,763,636 A | 6/1998 | Kreuder et al. | ................. 558/46 |
| 5,859,211 A | 1/1999 | Kreuder et al. | ................. 528/403 |
| 5,900,327 A | 5/1999 | Pei et al. | ................. 428/690 |
| 2003/0082405 A1* | 5/2003 | Taguchi | ................. 428/690 |
| 2003/0124382 A1* | 7/2003 | Taguchi et al. | ................. 428/690 |

FOREIGN PATENT DOCUMENTS

WO     WO97/05184     2/1997

OTHER PUBLICATIONS

Mezlova et al., Synthesis of New Thieno[3,2-b]Indole Derivatives and Electrochemical Preparation of their Conducting Oligomers, 10th Blue Danube Symposium on Heterocyclic Chemistry, Sep. 3-6, 2003, Vienna, Austria, hereinafter known as Mezlova.*
Mezlova et al., "Novel conducting polymers based on thieno[3,2-b]indoles: Electrochemical properties and molecular structure", Journal of Electroanalytical Chemistry, (2005), 581, 93-103.*
Burroughes, et al.; Light-emitting diodes based on conjugated polymers; Nature, vol. 347, 539; Oct. 11, 1990.

* cited by examiner

*Primary Examiner*—D. L Tarazano
*Assistant Examiner*—Brett A Crouse
(74) *Attorney, Agent, or Firm*—Robert E. Bushnell, Esq.

(57) ABSTRACT

A thieno[3,2-b]indole-based polymer and an organo-electroluminescent device in which the polymer is introduced into an organic layer are provided. The thieno[3,2-b]indole-based polymer may be easily prepared and has blue light-emitting characteristic. The organo-electroluminescent device adopting the organic layer using the thieno[3,2-b]indole-based polymer has improved color purity, efficiency, and luminance characteristics.

13 Claims, 3 Drawing Sheets

THIENO[3,2-B]INDOLE BASED POLYMER AND ORGANO-ELECTROLUMINESCENT DEVICE USING THE SAME

CLAIM OF PRIORITY

This application claims the benefit of Korean Patent Application No. 2004-7824, filed on Feb. 6, 2004, in the Korean Intellectual Property Office, the disclosure of which is incorporated herein in its entirety by reference.

BACKGROUND OF THE INVENTION

1. Field of the Invention

The present invention relates to a compound having thieno [3,2-b]indole structure and to an organo-electroluminescent device using the same, and more particularly, to a thieno[3,2-b]indole-based polymer which has blue light-emitting characteristic and can be easily prepared, and to an organo-electroluminescent device using the polymer as an organic layer forming material.

2. Description of the Related Art

In general, an organo-electroluminescent device is constructed with an organic light-emitting layer which is interposed between a cathode and an anode. In the organic light-emitting layer, electrons and holes injected from the cathode and the anode are combined to generate excitons. Light is emitted as a result of the transition of the generated excitons from an excited state to a ground state.

With the developments of a laminated structure having an aluminum quinolinol complex layer and a triphenylamine derivative layer as disclosed in U.S. Pat. No. 4,885,211 entitled Electroluminescent device with improved cathode to Tang, et al. and issued on Dec. 5, 1989 and of a compound for forming the light-emitting layer using a low molecular weight compound as disclosed in U.S. Pat. No. 5,151,629 entitled Blue emitting internal junction organic electroluminescent device (I) to VanSlyke and issued on Sep. 29, 1992, organo-electroluminescent devices capable of emitting various light in the range of from ultra violet ray to infrared ray could be manufactured.

An organo-electroluminescent device using a conjugated polymer, polyphenylenevinylene (PPV), as a light-emitting layer forming material was proposed in Nature, Vol. 347, 539, 1990. Thereafter, a novel PPV-based polymer, which is dissolved in an organic solvent and has good chemical stability and luminous efficiency, and polyfluorene having better performance than the PPV-based polymer were developed. Polyfluorene has blue light-emitting characteristic, but does not have satisfactory color purity characteristic due to excimers derived from side chains of polyfluorene structure (WO 9705184 and U.S. Pat. No. 5,900,327 entitled Polyfluorenes as materials for photoluminescence and electroluminescence to Pei, et al. and issued on May 4, 1999).

To improve the color purity characteristic of polyfluorene, polyspirofluorene (U.S. Pat. No. 5,621,131 entitled Conjugated polymers having spiro centers and their use as electroluminescence materials to Kreuder, et al. and issued on Apr. 15, 1997), spirobifluorene, or hetero atom-containing spirofluorene (U.S. Pat. No. 5,763,636 entitled Polymers containing spiro atoms and methods of using the same as electroluminescence materials to Kreuder, et al. and issued on Jun. 9, 1998 and U.S. Pat. No. 5,859,211 entitled Conjugated polymers containing heterospiro atoms and their use as electroluminescence materials to Kreuder, et al. and issue on Jan. 12, 1999) structures were developed. However, these substances do not have sufficient lifetime, efficiency, reliance, processing ability, and color purity characteristics, and thus must be improved.

SUMMARY OF THE INVENTION

It is therefore an object of the present invention to provide an improved compound for an organic layer.

It is further an object of the present invention to provide a thieno[3,2-b]indole-based polymer having improved color purity, efficiency and luminance characteristics and an organo-electroluminescent device using the same.

It is also an object of the present invention to provide an improved organo-electroluminescent device.

To achieve above and other objects of the present invention, the present invention may be constructed with thieno[3,2-b]indole-based polymer which includes a unit. wherein $R_1$, $R_2$, $R_3$, $R_4$, and $R_5$ are independently selected from the group consisting of a hydrogen atom, a hydroxy group, an amino group, a substituted or unsubstituted $C_{1-30}$ alkyl amino group, a substituted or unsubstituted $C_{1-30}$ aryl amino group, a substituted or unsubstituted $C_{1-30}$ heteroaryl amino group, a cyano group, a halogen atom, a substituted or unsubstituted $C_{1-30}$ alkyl group, a substituted or unsubstituted $C_{3-30}$ cycloalkyl group, a substituted or unsubstituted $C_{1-30}$ alkoxy group, a substituted or unsubstituted $C_{6-30}$ aryl group, a substituted or unsubstituted $C_{6-30}$ arylalkyl group, a substituted or unsubstituted $C_{2-30}$ heteroaryl group, and a substituted or unsubstituted $C_{2-30}$ heterocyclic group, and $R_2$ and $R_3$ may be connected to each other to form a saturated or unsaturated ring.

According to an aspect of the present invention, there is provided a thieno[3,2-b]indole-based polymer represented by Formula (1) below:

(1)

where $R_1$, $R_2$, $R_3$, $R_4$, and $R_5$ are independently selected from the group consisting of a hydrogen atom, a hydroxy group, an amino group, a substituted or unsubstituted $C_{1-30}$ alkyl amino group, a substituted or unsubstituted $C_{1-30}$ aryl amino group, a substituted or unsubstituted heteroaryl amino group, a cyano group, a halogen atom, a substituted or unsubstituted $C_{1-30}$ alkyl group, a substituted or unsubstituted $C_{3-30}$ cycloalkyl group, a substituted or unsubstituted $C_{1-30}$ alkoxy group, a substituted or unsubstituted $C_{6-30}$ aryl group, a substituted or unsubstituted $C_{6-30}$ arylalkyl group, a substituted or unsubstituted $C_{2-30}$ heteroaryl group, and a substituted or unsubstituted $C_{2-30}$ heterocyclic group, and $R_2$ and $R_3$ may be connected to each other to form a saturated or unsaturated ring; and z is a degree of polymerization and a real number of 5 to 1000.

According to another aspect of the present invention, there is provided an organo-electroluminescent device including an organic layer between a pair of electrodes, in which the organic layer includes the above thieno[3,2-b]indole-based polymer.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Hereinafter, the present invention will be described in more detail.

The present invention may be constructed with a polymer which includes a unit. wherein $R_1$, $R_2$, $R_3$, $R_4$, and $R_5$ are independently selected from the group consisting of a hydrogen atom, a hydroxy group, an amino group, a substituted or unsubstituted $C_{1-30}$ alkyl amino group, a substituted or unsubstituted $C_{1-30}$ aryl amino group, a substituted or unsubstituted $C_{1-30}$ heteroaryl amino group, a cyano group, a halogen atom, a substituted or unsubstituted $C_{1-30}$ alkyl group, a substituted or unsubstituted $C_{3-30}$ cycloalkyl group, a substituted or unsubstituted $C_{1-30}$ alkoxy group, a substituted or unsubstituted $C_{6-30}$ aryl group, a substituted or unsubstituted $C_{6-30}$ arylalkyl group, a substituted or unsubstituted $C_{2-30}$ heteroaryl group, and a substituted or unsubstituted $C_{2-30}$ heterocyclic group, and $R_2$ and $R_3$ may be connected to each other to form a saturated or unsaturated ring.

According to an aspect of the present invention, there is provided a thieno[3,2-b]indole-based polymer represented by Formula (1) below:

where $R_1$, $R_2$, $R_3$, $R_4$, and $R_5$ are independently selected from the group consisting of a hydrogen atom, a hydroxy group, an amino group, a substituted or unsubstituted $C_{1-30}$ alkyl amino group, a substituted or unsubstituted $C_{1-30}$ aryl amino group, a substituted or unsubstituted heteroaryl amino group, a cyano group, a halogen atom, a substituted or unsubstituted $C_{1-30}$ alkyl group, a substituted or unsubstituted $C_{3-30}$ cycloalkyl group, a substituted or unsubstituted $C_{1-30}$ alkoxy group, a substituted or unsubstituted $C_{1-30}$ aryl group, a substituted or unsubstituted $C_{6-30}$ arylalkyl group, a substituted or unsubstituted $C_{2-30}$ heteroaryl group, and a substituted or unsubstituted $C_{2-30}$ heterocyclic group, and $R_2$ and $R_3$ may be connected to each other to form a saturated or unsaturated ring; and z is a degree of polymerization and a real number of 5 to 1000.

The polymer represented by Formula (1) above has repeat units with a thieno[3,2-b]indole structure, thereby inhibiting aggregation due to interaction between molecules and preventing excimers and exciplexs from generating. Also, the polymer can easily transport charges and has blue light-emitting characteristic. In other words, if generation of an excimer level is inhibited, luminous efficiency and color purity are improved.

The thieno[3,2-b]indole-based polymer represented by Formula (1) may be represented by the following Formula (2) or (3) which further includes arylene (Ar) repeat units.

In Formula (2), $R_1$, $R_2$, $R_3$, $R_4$, and $R_5$ are the same as in Formula (1);

Ar may be a substituted or unsubstituted $C_{6-30}$ arylene group, a substituted or unsubstituted $C_{2-30}$ heteroarylene group, or a substituted or unsubstituted $C_{2-30}$ heterocyclic group;

x is a real number from 0.01 to 0.99;

y is a real number from 0.01 to 0.99; and z is degree of polymerisation and is a real number from 5 to 1,000.

(3)

In Formula (3), $R_1$, $R_2$, $R_3$, $R_4$, $R_5$, and Ar are the same as in Formula (1);

Ar may be a substituted or unsubstituted $C_{6-30}$ arylene group, a substituted or unsubstituted $C_{2-30}$ heteroarylene group, or a substituted or unsubstituted $C_{2-30}$ heterocyclic group;

x is a real number from 0.01 to 0.99;

y is a real number from 0.01 to 0.99; and z is a degree of polymerisation and is a real number from 5 to 1000.

In the above Formulas (1) through (3), z represents the degree of polymerisation of the thieno[3,2-b]indole repeat unit in the entire polymer, x represents a ratio of the thieno[3,2-b]indole repeat unit in the entire polymer, and y represents a ratio of the arylene repeat unit in the entire polymer.

The thieno[3,2-b]indole-based polymer represented by Formula (2) above may particularly be a polymer represented by Formula (4) below.

(4)

In Formula (4), $R_6$ through $R_{10}$ are the same as or different from one another and are a $C_{1-12}$ alkyl group or a $C_{6-20}$ aryl group;

x is a number from 0.01 to 0.99;

y is a number from 0.01 to 0.99; and z is a real number from 5 to 1000.

An example of the polymer represented by Formula (4) may be a polymer represented by Formula (5) below.

(5)

In Formula (5), x is a number from 0.01 to 0.99;

y is a number from 0.01 to 0.99; and z is a real number from 5 to 1000.

The number average molecular weight ($M_n$) of the thieno [3,2-b]indole-based polymer according to an embodiment of the present invention may be in the range of 10,000 to 200,000. The molecular weight of the polymer acts as a critical factor in the thin film forming characteristic and lifetime of the device when manufacturing the electroluminescent device. When the number average molecular weight of the polymer is less than 10,000, crystallization, etc. may occur during manufacturing and driving of an electroluminescent device Meanwhile, when the number average molecular weight of the polymer is too high (i.e., higher than 200,000), the solubility and processing ability of the polymer become poor.

It is known that a narrow molecular weight distribution of the thieno[3,2-b]indole-based polymer is advantageous to various electroluminescence characteristics, in particular lifetime of the device. In the present invention, the molecular weight distribution of the polymer is restricted to the range of 1.5 to 5.

The term "substituted" used in the definitions of substituents in Formulas of the present invention means to be substituted with an optional substituent. Examples of the substituent may include a $C_{1-12}$ alkyl group, a $C_{1-12}$ alkoxy group, a halogen atom such as fluorine or chlorine, a $C_{1-30}$ alkylamino group, a hydroxy group, a nitro group, a cyano group, a substituted or unsubstituted amino group (—$NH_2$, —NH(R), or —N(R')(R"), in which, R, R' and R" are independently a $C_{1-12}$ alkyl group), a carboxylic group, a sulfonic group, a phosphoric group, a $C_{1-20}$ halogenated alkyl group, a $C_{2-20}$ alkenyl group, a $C_{2-20}$ alkynyl group, a $C_{1-20}$ heteroalkyl group, a $C_{6-20}$ aryl group, an $C_{6-20}$ arylalkyl group, a $C_{2-20}$ heteroaryl group, or a $C_{2-20}$ heteroarylalkyl group.

The thieno[3,2-b]indole-based polymer represented by Formula (1) of the present invention is synthesized as follows:

First, thieno[3,2-b]indole monomers are synthesized and the monomers are polymerised to prepare the thieno[3,2-b]indole-based polymer represented by Formula (1).

The polymer represented by Formula (2) or (3) may be obtained by copolymerising thieno[3,2-b]indole monomers and arylene repeat unit-containing compounds. During copolymerising, a catalyst, such as bis(cyclooctadienyl)nikel, is used [J. I. Lee, G. Klaerner, and R. D. Miller, Chem. Mater. 11, 1083 (1999)].

An organo-electroluminescent device using the thieno[3,2-b]indole-based polymer according to the present invention will now be described in more detail.

Figure 1:
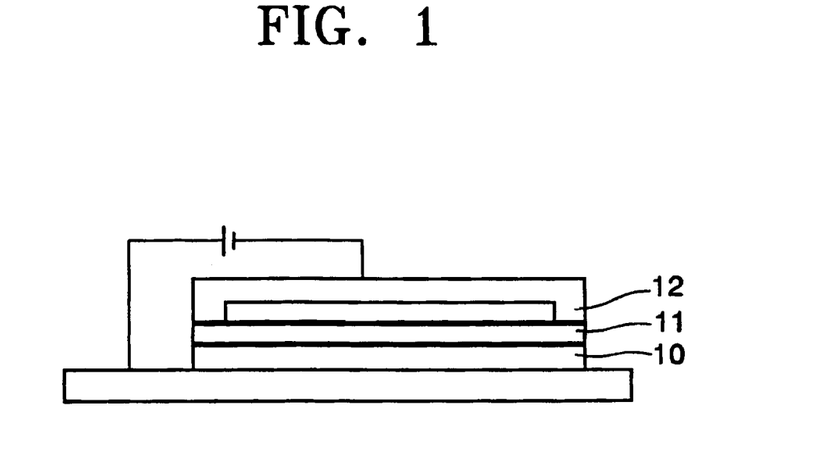
FIG. 1 shows a structure of a conventional organo-electroluminescent device.

The organo-electroluminescent device of the present invention is manufactured by forming an organic layer, such as a light-emitting layer, using the thieno[3,2-b]indole-based polymer represented by Formula (1) above. Such organo-electroluminescent device may usually have a laminated structure that an anode 10, a light-emitting layer 11, and a cathode 12 are stacked as shown in FIG. 1. Alternatively, the structure of the organo-electroluminescent device may be, but is not limited to, an anode/a buffering layer/a light-emitting layer/a cathode, an anode/a 11 hole transport layer/a light-emitting layer/a cathode, an anode/a buffering layer/a hole transport layer/a light-emitting layer/a cathode, an anode/a buffering layer/a hole transport layer/a light-emitting layer/an electron transport layer/a cathode, or an anode/a buffering layer/a hole transport layer/a light-emitting layer/a hole blocking layer/a cathode. The buffering layer may be formed of materials commonly used in the art, and examples of the material can include, but are not limited to, copper phthalocyanine, polythiophene, polyaniline, polyacetylene, polypyrrole, polyphenylene vinylene, or a derivative thereof.

The hole transport layer may be formed of materials commonly used in the art, and examples of the material can include, but are not limited to, polytriphenylamine.

The electron transport layer may be formed of materials commonly used in the art, and examples of the materials include, but are not limited to, polyoxadiazole.

The hole blocking layer may be formed of materials commonly used in the art, and examples of the material can include, but are not limited to, LiF, $BaF_2$, and $MgF_2$.

The organo-electroluminescent device of the present invention may be manufactured by a typical method of manufacturing an organo-electroluminescent device using a light-emitting polymer, without using a particular apparatus or method.

The present invention will be described in greater detail with reference to the following examples. The following examples are for illustrative purposes and are not intended to limit the scope of the invention.

SYNTHESIS EXAMPLE 1

Preparation of Polymer of Formula (5)

(1) Preparation of Compound (A)

Reaction scheme (1)

As shown in the above reaction scheme (1), the compound (A) was prepared according to the following procedure.

(a) Synthesis of 2-(2'-nitro-phenyl)-thiophene (A')

14.07 g (110 mmol) of 2-thiophene-boronic acid, 24.9 g (100 mmol) of 1-iodo-2-nitrobenzene, and 5.78 g (5 mmol) of tetrakis(triphenylphosphine)palladium(0) were dissolved in 250 ml of ethylene glycol dimethyl ether (DME), and 70 ml of 2M $K_2CO_3$ aqueous solution was added to the solution, and then the mixture was refluxed at 80° C. for 12 hours. After the reaction was completed, an organic layer was isolated and concentrated, and then isolated by column chromatography using hexane, thereby obtaining 22.1 g (yield: 98%) of 2-(2'-nitrophenyl)-thiophene (A').

(b) Synthesis of 2-(2'-azido-phenyl)-1-thiophene (B')

20.5 g (100 mmol) of 2-(2'-nitro-phenyl)-thiophene was dissolved in 100 ml of 50% ethanol and 16.75 g (300 mmol) of Fe was added to the solution. Then, 2 ml of concentrated hydrochloric acid (HCl) was added to the mixture and refluxed for 3 hours. The mixture was cooled to room temperature and neutralized using 20% NaOH aqueous solution. The solution was twice extracted with 100 ml of chloroform and concentrated, and then filtrated through column chromatography and concentrated to obtain 14.35 g (81.9 mmol) of 2-(thiophen-2'-yl)phenylamine. 10 g (57.1 mmol) of the resulting compound was dissolved in 29 ml of concentrated sulfuric acid and the solution was slowly dropped into a solution of 4.14 g (60 mmol) of NaNO$_2$ in 97 ml of distilled water at 0° C., and then the mixture was reacted at room temperature for 2 hours. 4.08 g (61.81 mmol) of NaN$_3$ was dissolved in 10 ml of hydrochloric acid and slowly added to the reaction mixture, and then the mixture was reacted at lower temperature than 5° C. for 3 hours. After the reaction was completed, the resulting product was neutralized using 20% KOH solution, extracted with chloroform, concentrated, isolated, and purified through column chromatography using hexane. As a result, 8.839 g (yield: 77%) of 2-(2'-azido-phenyl)-thiophene (B') was obtained.

(c) Synthesis of 4H-thieno[3,2-b]indole (C')

5.0 g of 2-(2'-azido-phenyl)-thiophene (B') was dissolved in 100 ml of ortho-dichlorobenzene and the solution was refluxed at 180° C. for 12 hours. After the reaction was completed, the resulting solution was dried and purified by column chromatography using toluene. Finally, 3.12 g (yield: 77%) of 4H-thieno[3,2-b]indole (C') was obtained.

(d) Synthesis of 4-(4'-octyloxy-phenyl)-4H-thieno[3,2-b]indole (D')

3.0 g (17.3 mmol) of 4H-thieno[3,2-b]indole (C'), 4.93 g (17.3 mmol) of 1-bromo-4-octyloxybenzene, and 0.0025 g (1.114×10$^{-2}$ mmol) of tris(dibenzylideneacetone)dipalladium(0) were dissolved in 1.9 g (19.8 mmol) of t-BuONa, 0.003 g (1.5×10$^2$ mmol) of t-butylphosphine, and 50 ml of xylene and the solution was refluxed at 120° C. for 24 hours. Then, the solvent was removed and the resulting product was isolated and purified by column chromatography using toluene/hexane (⅓ by volume) as an eluent, thereby obtaining 5.35 g (yield: 82%) of 4-(4'-octyloxy-phenyl)-4H-thieno[3,2-b]indole (D').

(e) Synthesis of 2,7-dibromo-4-(4'-octyloxy-pheyl)-4H-thieno[3,2-b]indole (A)

5 g (9.37 mmol) of 4-(4'-octyloxy-phenyl)-4H-thieno[3,2-b]indole (D') was dissolved in 150 ml of chloroform and 3.34 g (18.7 mmol) of bromine was slowly added to the solution at 0° C., and then the mixture was reacted at room temperature for 6 hours. After the reaction was completed, the resulting product was neutralized using 2M K$_2$CO$_3$ and extracted with water and chloroform, and then the solvent was removed from the extracted chloroform layer. Then, the residue was isolated and purified by column chromatography using a mixing solvent of toluene/hexane (⅓ by volume). Finally, 4.65 g (yield: 90%) of 2,7-dibromo-4-(4'-octyloxy-phenyl)-4H-thieno[3,2-b]indole (A) was obtained.

(2) Synthesis of Polymer

As shown in the above reaction scheme (2), the polymer represented by formula (5) below was prepared according to the following procedure.

(5)

A Schlenk flask was vacuumed and refluxed with nitrogen gas several times to completely remove moisture. 880 mg (3.2 mmol) of bis(1,5-cyclooctadiene)nickel(0) and 500 mg (3.2 mmol) of bipyridine were charged into the Schlenk flask in a glove box, and then, the flask was vacuumed and refluxed with nitrogen gas several times again. 10 ml of anhydrous dimethylformamide (DMF), 346 mg (3.2 mmol) of 1,5-cyclooctadiene (COD), and 10 ml of anhydrous toluene were added to the flask under nitrogen atmosphere. After the mixture was stirred at 70° C. for 30 min, a diluted solution of 85.3 mg (0.16 mmol) of the compound (A) and 1.05 g (1.44 mmol) of 2,7-dibromo 2',3'-di(2-ethyl)hexyloxyspirofluorene (B) in 10 ml of toluene was added to the mixture. Next, 10 ml of toluene was added to the mixture while washing materials adhered to the flask wall, and then the mixture was stirred at 70° C. for 4 days. After 4 days, 36.1 mg (0.112 mmol) of (4-bromophenyl)diphenylamine was added to the mixture and stirred at 70° C. for 1 day. After the reaction was completed, the temperature of the reactant was lowered to room temperature and the reactant was poured into a mixture of HCl, acetone, and methanol (1:1:2 by volume) to form precipitates. The precipitates thus formed were dissolved in chloroform, and then reprecipitated in methanol to form precipitates. The precipitates were Soxhlet extracted to obtain 450 mg of a polymer. As a result of analysing the polymer using gel permeation chromatography (GPC), the number average molecular weight (Mn) was 167,000 and the molecular weight distribution (MWD) was 1.93. In the above Formula (5), x and y are 0.1 and 0.9, respectively.

Figure 2:
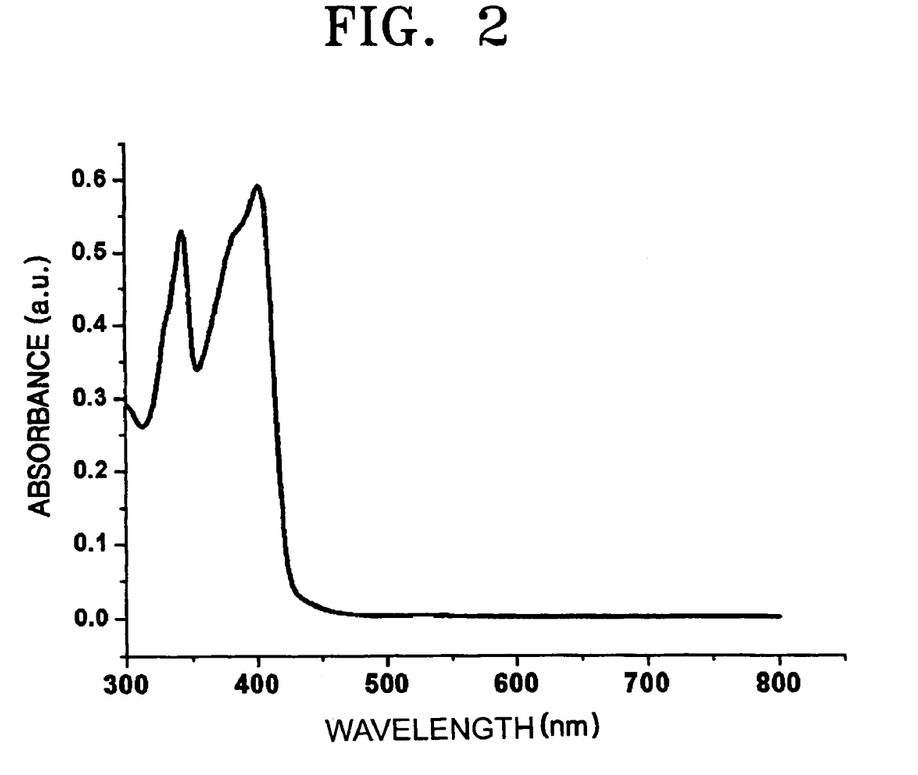
FIGS. 2 and 3 are an UV absorption spectrum and a photoluminescence spectrum, respectively, of a polymer obtained according to Synthesis Example 1 of the present invention.
Figure 3:
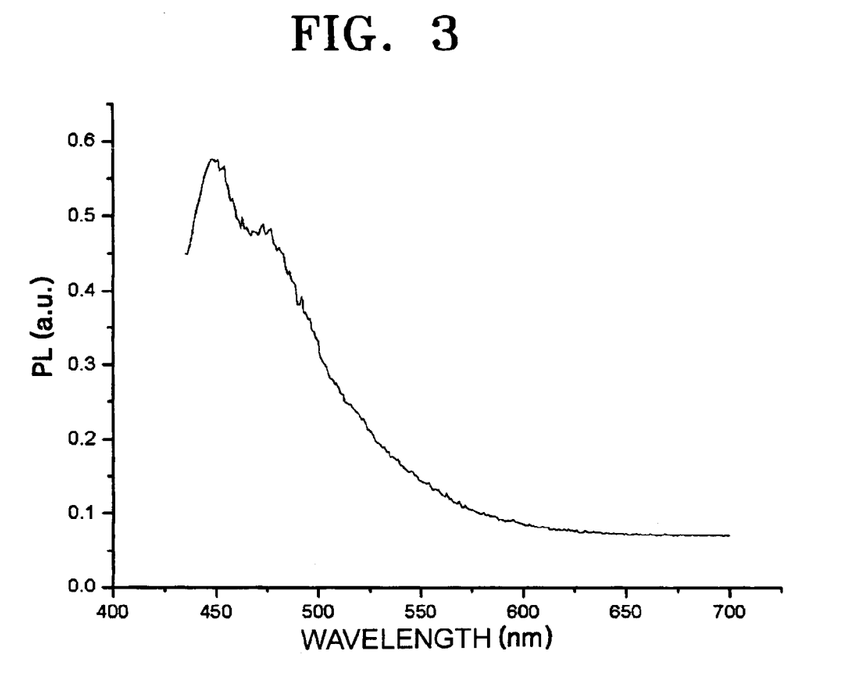

UV absorption spectrum and photoluminescence spectrum of the polymer obtained according to Synthesis Example 1 were investigated and the results are shown in FIGS. 2 and 3.

Referring to FIGS. 2 and 3, the polymer is a light-emitting material having blue electroluminescence characteristic.

EXAMPLE 1

Manufacturing of an Organic Electroluminescent Device

An electroluminescent device was manufactured using the polymer prepared in Synthesis Example 1 in accordance with the following procedure.

First, after a transparent electrode substrate, which is a glass substrate coated with ITO (indium-tin oxide), was cleaned, the ITO was patterned in desired pattern by using a photoresist resin and an etchant, and the substrate was again cleaned. Batron P 4083 (obtained from Bayer Company) as a conductive buffer layer was coated on the patterned ITO to a thickness of about 80 nm, and then baked at 180° C. for about 1 hour. A solution for forming a light-emitting layer prepared by dissolving 0.1 parts by weight of the polymer represented by Formula (5) in 99.9 parts by weight of toluene was spin-coated on the buffering layer and baked. The solvent was completely removed in a vacuum oven to from polymer thin film. At this step, the spin-coating of the polymer solution was carried out after the polymer solution had been passed through a 0.2 mm filter. The thickness of the polymer thin film was controlled within the range from 80 nm by changing the concentration of the polymer solution and spin speed. Ca and Al were sequentially deposited on the electroluminescent polymer thin film using a vacuum depositor under the vacuum lower than $4 \times 10^{-6}$ torr. When depositing, the thickness and the growth speed of the layer were controlled by a crystal sensor.

Figure 4:
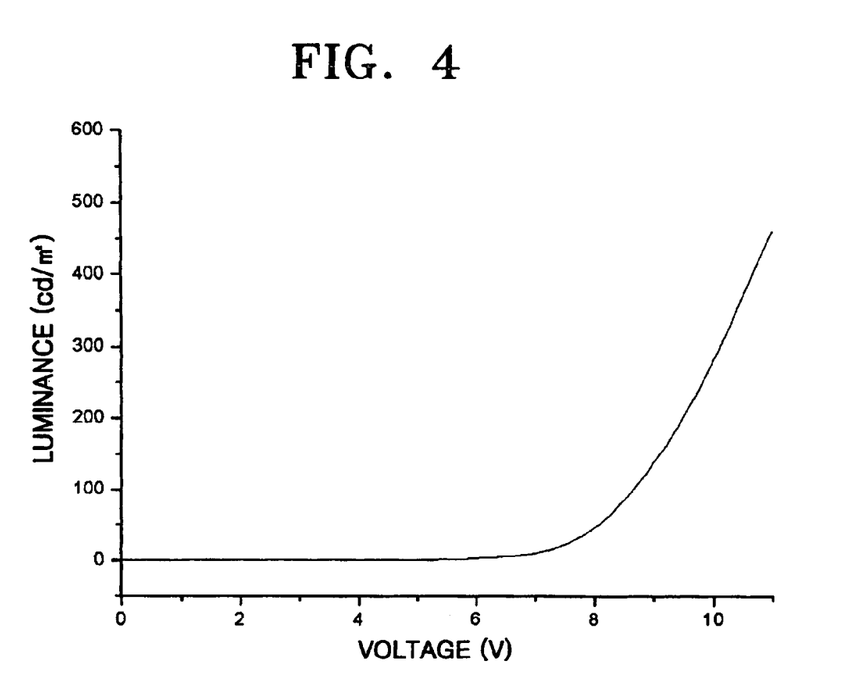
FIG. 4 is a graph showing a luminance-voltage relationship of an organo-electroluminescent device manufactured according to Example 1 of the present invention.
Figure 5:
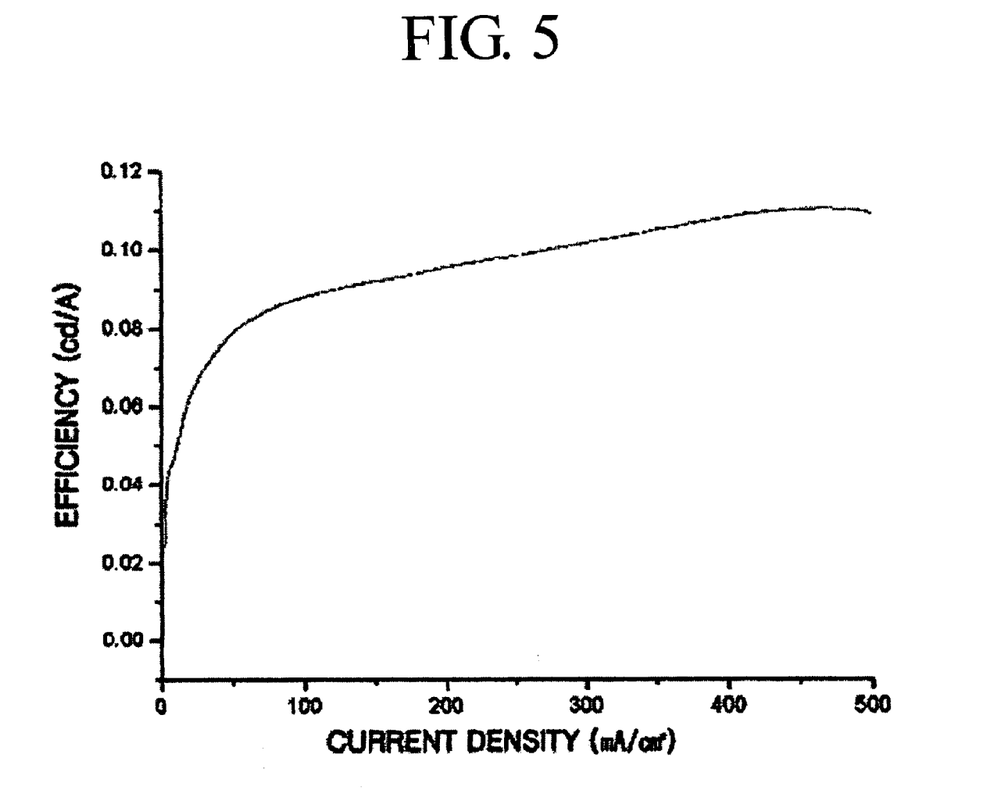
FIG. 5 is a graph showing an efficiency-current density relationship of an organo-electroluminescent device manufactured according to Example 1 of the present invention.

The luminance and efficiency characteristics of the organo-electroluminescent devices manufactured in the above Example 1 were evaluated and the respective results are shown in FIGS. 4 and 5. The forward bias voltage, which is a direct voltage, was used as a turn-on voltage. The devices all showed typical properties of a rectifying diode. In particular, the device using the polymer prepared in Synthesis Example 1 showed excellent stability and that the 11 initial voltage-current density characteristic was maintained even after repeated driving of the device several times.

As is apparent from FIGS. 4 and 5, the organo-electroluminescent device of Example 1 had good luminance and efficiency characteristics.

As described above, the thieno[3,2-b]indole-based polymer has blue electroluminescence characteristic. Also, the thieno[3,2-b]indole-based polymer may be easily prepared and has blue light-emitting characteristic. The organo-electroluminescent device adopting the organic layer using the thieno[3,2-b]indole-based polymer has improved color purity, efficiency, and luminance characteristics.

The thieno[3,2-b]indole-based polymer according to the present invention has blue electroluminescence characteristic and the organo-electroluminescent device having improved color purity, efficiency, and luminance characteristics can be manufactured by adopting the organic layer using the same.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thieno[3,2-b]indole-based polymer represented by Formula (4):

(4)

wherein $R_6$ through $R_{10}$ are independently selected from the group consisting of a $C_{1-12}$ alkyl group and a $C_{6-20}$ aryl group;
x is a number from 0.01 to 0.99;
y is a number from 0.01 to 0.99; and
z is a real number from 5 to 1000.

2. The thieno[3,2-b]indole-based polymer of claim 1, wherein said polymer is represented by Formula (5):

wherein x is a number from 0.01 to 0.99;
y is a number from 0.01 to 0.99; and
z is a real number from 5 to 1000.

3. The thieno[3,2-b]indole-based polymer of claim 1, wherein said polymer has a number average molecular weight of from 10,000 to 200,000 and a molecular weight distribution of from 1.5 to 5.

4. An organo-electroluminescent device comprising an organic layer comprising the thieno[3,2-b]indole-based polymer of claim 1 between a pair of electrodes.

5. An organo-electroluminescent device, comprising:
a pair of electrodes;
an organic layer between said pair of electrodes, said organic layer including a thieno[3,2-b]indole-based polymer selected from the group consisting of a polymer represented by Formula (4):

(4)

wherein $R_6$ through $R_{10}$ are independently selected from the group consisting of a $C_{1-12}$ alkyl group and a $C_{6-20}$ aryl group;
x is a real number from 0.01 to 0.99;
y is a real number from 0.01 to 0.99; and
z is a degree of polymerization and a real number from 5 to 1000.

6. The organo-electroluminescent device of claim 5, wherein the organic layer is a light-emitting layer.

7. The organo-electroluminescent device of claim 5, wherein the polymer is represented by Formula (5):

(5)

(5)

wherein x is a number from 0.01 to 0.99;

y is a number from 0.01 to 0.99; and z is a real number from 5 to 1000.

8. The organo-electroluminescent device of claim 7, wherein the polymer has a number average molecular weight of from 10,000 to 200,000 and a molecular weight distribution of from 1.5 to 5.

9. The organo-electroluminescent device of claim 5, wherein the polymer has a number average molecular weight of from 10,000 to 200,000 and a molecular weight distribution of from 1.5 to 5.

10. An organo-electroluminescent device, comprising:

a pair of electrodes;

an organic layer between said pair of electrodes, said organic layer including a polymer represented by Formula (4):

(4)

wherein $R_6$ through $R_{10}$ are independently selected from the group consisting of a $C_{1-12}$ alkyl group and a $C_{6-20}$ aryl group;

x is a number from 0.01 to 0.99;

y is a number from 0.01 to 0.99; and z is a real number from 5 to 1000.

11. The organo-electroluminescent device of claim 10, wherein the polymer is represented by Formula (5):

(5)

wherein x is a number from 0.01 to 0.99;

y is a number from 0.01 to 0.99; and z is a real number from 5 to 1000.

12. The organo-electroluminescent device of claim 10, wherein the organic layer is a light-emitting layer.

13. The organo-electroluminescent device of claim 10, the polymer has a number average molecular weight of from 10,000 to 200,000 and a molecular weight distribution of from 1.5 to 5.

* * * * *